United States Patent
Nishimura et al.

(10) Patent No.: US 10,196,733 B2
(45) Date of Patent: Feb. 5, 2019

(54) SPUTTERING TARGET

(71) Applicant: Idemitsu Kosan Co., Ltd., Chiyoda-ku, Tokyo (JP)

(72) Inventors: Mami Nishimura, Sodegaura (JP); Shigeo Matsuzaki, Sodegaura (JP); Masashi Ohyama, Sodegaura (JP)

(73) Assignee: IDEMITSU KOSAN CO., LTD., Tokyo (JP)

(*) Notice: Subject to any disclaimer, the term of this patent is extended or adjusted under 35 U.S.C. 154(b) by 390 days.

(21) Appl. No.: 14/404,522

(22) PCT Filed: May 31, 2013

(86) PCT No.: PCT/JP2013/003445
§ 371 (c)(1),
(2) Date: Jul. 8, 2015

(87) PCT Pub. No.: WO2013/179676
PCT Pub. Date: Dec. 5, 2013

(65) Prior Publication Data
US 2015/0354053 A1    Dec. 10, 2015

(30) Foreign Application Priority Data

May 31, 2012 (JP) ................................. 2012-125450

(51) Int. Cl.
*C23C 14/08* (2006.01)
*H01J 37/34* (2006.01)
(Continued)

(52) U.S. Cl.
CPC .......... *C23C 14/086* (2013.01); *C04B 35/453* (2013.01); *C23C 14/08* (2013.01);
(Continued)

(58) Field of Classification Search
CPC .......................... C04B 35/457; C04B 35/453
(Continued)

(56) References Cited

U.S. PATENT DOCUMENTS 5,972,527 A    10/1999   Kaijou et al.
6,669,830 B1   12/2003   Inoue et al.
(Continued)

FOREIGN PATENT DOCUMENTS

CN    101268026 A    9/2008
JP    H06-236711 A   8/1994
(Continued)

OTHER PUBLICATIONS

Office Action issued in Japanese Patent Application No. 2014-518294 dated Aug. 16, 2016.
(Continued)

*Primary Examiner* — Khanh T Nguyen
(74) *Attorney, Agent, or Firm* — Foley & Lardner LLP (57) ABSTRACT

A sputtering target comprising an oxide sintered body that includes an indium element, a tin element and a zinc element, wherein the oxide sintered body includes one or more selected from a hexagonal layered compound represented by $In_2O_3(ZnO)_m$, a hexagonal layered compound represented by $InXO_3(ZnO)_n$, a rutile structure compound represented by $SnO_2$ and an ilmenite structure compound represented by $ZnSnO_3$, and a spinel structure compound represented by $Zn_2SnO_4$, in the formulas, X is a metal element that can form a hexagonal layered compound together with an indium element and a zinc element, m is an integer of 1 or more and n is an integer of 1 or more, and an agglomerate of the spinel structure compound is 5% or less of the entire sintered body.

16 Claims, 2 Drawing Sheets (51) Int. Cl.
C04B 35/453 (2006.01)
C23C 14/34 (2006.01)
C23C 14/58 (2006.01)

(52) U.S. Cl.
CPC ...... *C23C 14/3414* (2013.01); *C23C 14/5806* (2013.01); *H01J 37/3429* (2013.01); *C04B 2235/3206* (2013.01); *C04B 2235/3217* (2013.01); *C04B 2235/3224* (2013.01); *C04B 2235/3232* (2013.01); *C04B 2235/3244* (2013.01); *C04B 2235/3284* (2013.01); *C04B 2235/3286* (2013.01); *C04B 2235/3287* (2013.01); *C04B 2235/3293* (2013.01); *C04B 2235/3409* (2013.01); *C04B 2235/5409* (2013.01); *C04B 2235/5436* (2013.01); *C04B 2235/5445* (2013.01); *C04B 2235/763* (2013.01); *C04B 2235/767* (2013.01); *C04B 2235/77* (2013.01); *C04B 2235/80* (2013.01)

(58) Field of Classification Search
USPC ............... 204/192.15; 174/126.2; 428/1.1
See application file for complete search history.

(56) References Cited

U.S. PATENT DOCUMENTS

| | | | | |
|---|---|---|---|---|
| 8,153,031 | B2* | 4/2012 | Yano | ............... C04B 35/457 204/192.15 |
| 8,637,124 | B2 | 1/2014 | Yano et al. | |
| 2002/0158236 | A1 | 10/2002 | Kikkawa et al. | |
| 2006/0113565 | A1 | 6/2006 | Abe et al. | |
| 2009/0308635 | A1 | 12/2009 | Yano et al. | |
| 2010/0108502 | A1 | 5/2010 | Inoue et al. | |
| 2010/0170696 | A1* | 7/2010 | Yano | ..................... C04B 35/453 174/126.2 |
| 2010/0266787 | A1* | 10/2010 | Yano | ..................... C04B 35/453 428/1.1 |
| 2011/0155560 | A1 | 6/2011 | Kuramochi et al. | |
| 2011/0260121 | A1 | 10/2011 | Yano et al. | |
| 2013/0112971 | A1 | 5/2013 | Yano et al. | |
| 2014/0001040 | A1 | 1/2014 | Inoue et al. | |
| 2014/0339073 | A1 | 11/2014 | Inoue et al. | |

FOREIGN PATENT DOCUMENTS

| | | | | |
|---|---|---|---|---|
| JP | H10-147862 | A | 6/1998 | |
| JP | 2006-165529 | * | 6/2006 | .......... H01L 29/786 |
| JP | 2006-165532 | A | 6/2006 | |
| JP | 2008-163441 | A | 7/2008 | |
| JP | 2010-037161 | A | 2/2010 | |
| WO | WO-01/38599 | A1 | 5/2001 | |
| WO | WO-01/56927 | A1 | 8/2001 | |
| WO | WO-2007/037191 | A1 | 4/2007 | |
| WO | WO-2010/007989 | A1 | 1/2010 | |
| WO | WO-2010/058533 | A1 | 5/2010 | |
| WO | WO-2010/067571 | A1 | 6/2010 | |

OTHER PUBLICATIONS

International Search Report issued in PCT/JP2013/003445 dated Aug. 20, 2013.
Written Opinion of the International Searching Authority issued in PCT/JP2013/003445 dated Dec. 11, 2014 and its English translation.
Office Action issued in Chinese Patent Application No. 201380028477.4 dated Jan. 12, 2016.

* cited by examiner

SPUTTERING TARGET

CROSS REFERENCE TO RELATED APPLICATIONS

This application is the National Phase of PCT/JP2013/003445, filed May 23, 2013, which claims priority to Japanese Application No. 2012-125450, filed May 31, 2012, the entire contents of both are incorporated by reference in their entirety.

TECHNICAL FIELD

The invention relates to a sputtering target that comprises an oxide sintered body comprising an indium element, a tin element and a zinc element, a production method thereof, an oxide semiconductor thin film obtained by using the target, a thin film transistor provided with the target and an electronic apparatus provided with the transistor.

BACKGROUND ART

In a display device of various displays such as a liquid crystal display, a thin film transistor (TFT) that drives the display by applying a driving voltage is commonly used. In an activated layer therefor, a silicon-based material having excellent stability, processability or the like has been used.

However, since a silicon-based material absorbs light in the visible range, generation of carriers by incidence of light may cause a TFT to malfunction. If a light-shielding layer such as a metal is provided in order to prevent such malfunction, there are defects such as reduction in aperture ratio or an increase in power consumption since an increase in luminance of a backlight is required in order to keep the luminance of a screen.

For the production of a silicon-based material, even in the case of amorphous silicon that is believed to be capable of fabricating at low temperatures as compared with polycrystalline silicon, a high temperature of about 200° C. or more is required for film formation. Therefore, a polymer film having advantages that the cost is low, the weight is light and the film is flexible cannot be used as a substrate. Further, it has defects in respect of production that the device fabrication process at high temperatures involves a high energy cost and a long time is required for heating, or the like.

Under such circumstances, recently, in place of a silicon-based material, a TFT obtained by using a transparent oxide semiconductor has been developed. A transparent oxide semiconductor has attracted attention since it shows excellent properties as compared with conventional silicon-based materials. Specifically, it can be formed into a film at low temperatures without heating a substrate, can exhibit a high mobility of about 10 cm$^2$/Vs, or the like. Among transparent oxide semiconductors, a field effect transistor obtained by using amorphous In—Ga—Zn—O (IGZO) that contains indium gallium, zinc and oxygen as constituent elements is regarded as a promising transistor since it can have a high on-off ratio. Further, as the material having a high mobility, a field-effect transistor obtained by using an In—Sn—Zn—O (ITZO)-based material has attracted attention.

In addition, an ITZO-based material is advantageous since the raw material cost is low as compared with an IGZO-based material. In order to reduce the raw material cost, as a sputtering target having a composition region in which the amount of In or Ga that is expensive is reduced, a sputtering target composed of a spinel structure compound represented by $Zn_2SnO_4$ and a hexagonal layered compound represented by $In_2O_3(ZnO)_m$ (m is an integer of 3 to 6) is known, as described in Patent Documents 1 to 3. However, these targets involve a problem that generation of nodules or abnormal discharge tends to occur easily.

On the other hand, in the sputtering target having the above-mentioned composition region, there is a tendency that the target strength, specifically, the transverse rapture strength, becomes low. The reason therefor is considered as follows. In a composition including an increased amount of Zn, a hexagonal layered compound having a relatively low strength is spattered, the scattered hexagonal layered compound triggers breakage. Such lowering in strength of a sputtering target is problematic since cracks may be generated by thermal strain by thermal history at the time of target bonding or by plasma radiation heat at the time of sputtering, stress applied by polishing or by other handlings. Under such circumstances, a sputtering target having a higher strength is desired.

RELATED ART DOCUMENTS

Patent Documents

Patent Document 1: WO2010-067571
Patent Document 2: WO2007-037191
Patent Document 3: JP-A-H06-236711

SUMMARY OF THE INVENTION

An object of the invention is to provide, in a low-cost ITZO target having a small In region, a sputtering target that has a high strength and hardly suffers occurrence of abnormal discharge or generation of nodules.

According to the invention, the following sputtering target or the like are provided.

1. A sputtering target comprising an oxide sintered body that comprises an indium element, a tin element and a zinc element, wherein
   the oxide sintered body comprises one or more selected from a hexagonal layered compound represented by $In_2O_3(ZnO)_m$, a hexagonal layered compound represented by $InXO_3(ZnO)_n$, a rutile structure compound represented by $SnO_2$ and an ilmenite structure compound represented by $ZnSnO_3$, and a spinel structure compound represented by $Zn_2SnO_4$,
   in the formulas, X is a metal element that can form a hexagonal layered compound together with an indium element and a zinc element, m is an integer of 1 or more and n is an integer of 1 or more, and
   an agglomerate of the spinel structure compound is 5% or less of the entire sintered body.
2. The sputtering target according to 1, wherein the oxide sintered body comprises the hexagonal layered compound represented by $In_2O_3(ZnO)_m$.
3. The sputtering target according to 1 or 2, wherein the oxide sintered body comprises a gallium element.
4. The sputtering target according to 3, wherein the gallium element is in the solid solution state in one or more selected from the hexagonal layered compound represented by $In_2O_3(ZnO)_m$, the hexagonal layered compound represented by $InXO_3(ZnO)_n$, the rutile structure compound and the spinel structure compound.
5. The sputtering target according to 1 or 2, wherein X is a gallium element.
6. The sputtering target according to any of 1 to 5, wherein the oxide sintered body comprises the hexagonal layered compound represented by $InXO_3(ZnO)_n$.

7. The sputtering target according to any of 1 to 6, wherein the oxide sintered body does not comprise a bixbyite structure.
8. The sputtering target according to any of 1 to 7, wherein the hexagonal layered compound represented by $In_2O_3(ZnO)_m$ comprises needle-like crystals having an aspect ratio of 3 or more in an amount of 10% or more.
9. The sputtering target according to any of claims 1 to 8, wherein the atomic ratio of the indium element, the tin element and the zinc element is within the following range:

$0.01 \leq In/(In+Sn+Zn) \leq 0.35$ $0.15 \leq Sn/(In+Sn+Zn) \leq 0.55$ $0.3 \leq Zn/(In+Sn+Zn) \leq 0.7$ 10. The sputtering target according to 9, wherein the atomic ratio of the indium element, the tin element and the zinc element is within the following range:

$0.15 \leq In/(In+Sn+Zn) \leq 0.35$ $0.15 \leq Sn/(In+Sn+Zn) \leq 0.25$ $0.5 \leq Zn/(In+Sn+Zn) \leq 0.7$ 11. The sputtering target according to any of 3 to 8, wherein the atomic ratio of the indium element, the tin element, the zinc element and the gallium element is within the following range:

$0.01 \leq In/(In+Sn+Zn+Ga) \leq 0.35$ $0.15 \leq Sn/(In+Sn+Zn+Ga) \leq 0.55$ $0.3 \leq Zn/(In+Sn+Zn+Ga) \leq 0.7$ $0.01 \leq Ga/(In+Sn+Zn+Ga) \leq 0.35$ 12. The sputtering target according to 11, wherein the atomic ratio of the total of the indium element and the gallium element is within the following range:

$0.02 \leq (In+Ga)/(In+Sn+Zn) \leq 0.35$

13. The sputtering target according to any of 1 to 12, wherein the three-point bending strength of the oxide sintered body is 100 kPa or more.
14. A method for producing the sputtering target according to any of 1 to 13 comprising:
pulverizing and mixing raw material compounds at an integrated power of 200 Wh or more to produce powder mixture;
granulating the powder mixture to produce granulated powder having a BET surface area of 10 m$^2$/g or more and a median diameter obtained by means of a laser diffraction particle size analyzer of 1 μm or more and 100 μm or less;
forming the granulated powder to produce a formed body; and
sintering the formed body by retaining at a temperature of 1300° C. or higher for 12 hours or longer to obtain the oxide sintered body.
15. A sputtering target that is produced by the method according to 14.
16. An oxide semiconductor thin film formed by a sputtering method by using the sputtering target according to any of 1 to 13 and 15.
17. A thin film transistor comprising the oxide semiconductor thin film according to 16.
18. An electronic apparatus comprising the thin film transistor according to 17.

According to the invention, in an ITZO target having a small In region, it is possible to provide a sputtering target that hardly suffers occurrence of abnormal discharge or generation of nodules and has a further high strength.

BRIEF DESCRIPTION OF THE DRAWINGS

FIG. 1(B) is a photograph of an Sn atom and FIG. 1 (C) is a photograph of a Zn atom;

FIG. 3 is a photograph taken by EPMA of the oxide sintered body obtained in Comparative Example 1 (magnification ×1000), in which FIG. 3(A) is a photograph of an In atom, FIG. 3(B) is a photograph of an Sn atom, and FIG. 3(C) is a photograph of a Zn atom.

MODE FOR CARRYING OUT THE INVENTION

The sputtering target of the invention contains an oxide sintered body. The oxide sintered body comprises indium, tin and zinc as main constituents, and comprises one or more selected from a hexagonal layered compound represented by $In_2O_3(ZnO)_m$, a hexagonal layered compound represented by $InXO_3(ZnO)_n$, a rutile structure compound represented by $SnO_2$ and an ilmenite structure compound represented by $ZnSnO_3$, and a spinel structure compound represented by $Zn_2SnO_4$. In the formula, X is a metal element that can form a hexagonal layered compound together with an indium element and a zinc element, m is an integer of 1 or more, and n is an integer of 1 or more.

Meanwhile, the hexagonal layered compound, the rutile structure compound, the ilmenite structure compound and the spinel structure compound include a hexagonal layered compound, a rutile structure compound, an ilmenite structure compound and a spinel structure compound in a substitutional solid-solution state in which part of atoms or ions in the crystal structure are substituted by other atoms or in an interstitial solid-solution state in which other atoms are added to an interstitial site.

The above-mentioned sputtering target (oxide sintered body) may contain, in addition to the compounds mentioned above, a compound such as a corundum structure compound and a wurtzite-type structure compound or the like.

It is preferred that the sputtering target do not comprise a bixbyite structure.

The hexagonal layered compound represented by $In_2O_3(ZnO)_m$ is an $In_2O_3$—ZnO-based compound that has a natural superlattice structure, and is one of homologous compounds. Presence thereof can be confirmed by an X-ray diffraction (XRD) measurement, and the region can be judged by a mapping measurement by an electron probe microanalyzer (EPMA).

m is preferably an integer of 3 to 6.

The hexagonal layered compound represented by $InXO_3(ZnO)_n$ is one of homologous compounds and is a compound in which part of the In site is substituted with an X metal element. Presence thereof can be confirmed by XRD, and the region can be judged by a mapping measurement by EPMA.

n is preferably an integer of 1 to 7.

X is a metal element that can form a hexagonal layered compound together with an indium element and a zinc element. Gallium, aluminum, iron, a lanthanoid-based metal or the like can be given, with gallium being preferable.

The rutile structure compound represented by $SnO_2$ is a compound having a tetragonal crystal structure. Presence thereof can be confirmed by XRD, and the region can be judged by a mapping measurement by EPMA.

The ilmenite structure compound represented by $ZnSnO_3$ is a compound having a trigonal crystal structure. Presence thereof can be confirmed by XRD, and the region can be judged by a mapping measurement by EPMA.

The spinel structure compound represented by $Zn_2SnO_4$ is a compound having an isometric spinel crystal structure. Presence thereof can be confirmed by XRD, and the region can be judged by a mapping measurement by EPMA.

The oxide sintered body used in the invention preferably comprises, among the above-mentioned compounds, a hexagonal layered compound represented by $In_2O_3(ZnO)_m$ and a spinel structure compound represented by $Zn_2SnO_4$. Due to the presence of these compounds, not only the density of the sintered body is increased, but also the strength is increased to enable stable sputtering.

Further, the oxide sintered body used in the invention preferably comprises a hexagonal layered compound represented by $InXO_3(ZnO)_n$ and a spinel structure compound represented by $Zn_2SnO_4$. Due to the presence of these compounds, similarly, the density of the sintered body is increased and the strength of the sintered body is also increased. Further, due to the solid solution of the X metal, not only stable sputtering becomes possible, but also uniform film formation can be conducted.

When the sputtering target of the invention is observed by means of an electron probe microanalyzer (EPMA) for elements of In, Sn and Zn with a magnification of 1000, presence of a tin-rich phase and a zinc-rich phase is confirmed.

If the target does not comprise a rutile structure compound represented by $SnO_2$, the tin-rich phase is mainly a spinel structure compound. If the target comprises a rutile structure compound represented by $SnO_2$, the zinc-rich phase is mainly a spinel structure compound.

In the sputtering target of the invention, the tin-rich phase and the zinc-rich phase are dispersed uniformly, and the spinel structure compound is not present as a large-sized agglomerate.

A specific method for observation and measurement will be explained taking as an example a case where the sintered body comprises a hexagonal layered compound represented by $In_2O_3(ZnO)_m$ and a spinel structure compound represented by $Zn_2SnO_4$.

The in-plane distribution of each of an In element, an Sn element and a Zn element is obtained taking the threshold value of the EPMA image as 500 counts or more. The tin-rich phase (Sn-rich and Zn-small phase) is identified as a $Zn_2SnO_4$ phase, and a zinc-rich phase (Sn-small and Zn-rich phase) is identified as an $In_2O_3(ZnO)_m$ phase. If an observation is made in a backscattered electron image of SEM, a black phase can be identified as a zinc-rich phase and a gray phase can be identified as a tin-rich phase. In each field of view (280 μm×350 μm) of a backscattered electron image of SEM (magnification: ×300), a part where the long diameter of the Sn-rich phase is 30 μm or more is defined as an agglomerate. The area of a region occupied by the agglomerate is obtained by an image analysis. The ratio of the area occupied by the agglomerate relative to the total area is measured in five fields of view, and an average value thereof is obtained.

The area of the region occupied by the agglomerate of the spinel structure compound is 5% or less, preferably 3% or less, and further preferably 1.5% or less. If the area occupied by the agglomerate is 5% or less, occurrence of abnormal discharge can be suppressed easily, and uniformity of a thin film after film formation by sputtering becomes excellent.

In the oxide sintered body, the atomic ratio represented by In/(In+Sn+Zn) is preferably 0.01 to 0.35, more preferably 0.15 to 0.35, and further preferably 0.2 to 0.3.

If the atomic ratio is within the above-mentioned range, the $In_2O_3(ZnO)_m$ phase that has grown in the long axis direction is sufficiently formed, whereby a sintered body having an excellent strength can be obtained. Further, when a thin film is formed, the carrier concentration is not excessively increased.

Each atomic ratio is measured by means of an inductively coupled plasma atomic emission spectrometer.

The atomic ratio represented by Sn/(In+Sn+Zn) is preferably 0.15 to 0.55, more preferably 0.15 to 0.25, and further preferably 0.17 to 0.22.

If the atomic ratio is within the above-mentioned range, it is possible to prevent dissolution in a mix acid of phosphoric acid/nitric acid/acetic acid that is used for etching an Al electrode. Therefore, it can be applied to a back-channel etch type device or the like without causing problems. Further, the dissolution speed for oxalic acid is sufficient, and no adverse effects are exerted on the processing time when fabricating a TFT device.

The atomic ratio represented by Zn/(In+Sn+Zn) is preferably 0.3 to 0.7, more preferably 0.5 to 0.7, and further preferably 0.5 to 0.6.

If the atomic ratio is within the above-mentioned range, when a semiconductor film is formed by sputtering, it is not required to increase the oxygen partial pressure. If film formation is conducted at a high oxygen partial pressure, the film-forming speed may become slow, resulting in lowering in productivity. The atomic ratio can prevent such lowering. Further, If the atomic ratio is within the above-mentioned range, the $In_2O_3(ZnO)_m$ phase that has grown in the long axis direction is sufficiently formed, whereby a sintered body having an excellent strength can be obtained.

It is preferred that a hexagonal layered compound represented by $In_2O_3(ZnO)_m$ contained in the oxide sintered body be a crystal that has grown in the long axis direction and has an aspect ratio of 3 or more, more preferably 4 or more. Due to the presence of crystals that have grown in the long axis direction, the strength of an oxide sintered body is improved. Therefore, if the aspect ratio is 3 or more, a strength sufficient as a sputtering target can be ensured.

The aspect ratio is calculated by measuring the long axis length and the short axis length from an image obtained by an SEM observation. Specifically, an explanation is made in the Examples.

The $In_2O_3(ZnO)_m$ phase having an aspect ratio of 3 or more is contained in an amount of preferably 10% or more and 50% or less, more preferably 20% or more and 50% or less, and further preferably 25% or more and 50% or less of the entire $In_2O_3(ZnO)_m$ phase.

If the $In_2O_3(ZnO)_m$ phase having an aspect ratio of 3 or more is contained in an amount of 10% or more, a strength sufficient as a sputtering target can be ensured. If an amount of the In$_2$O$_3$(ZnO)$_m$ phase having an aspect ratio of 3 or more is 50% or less, the density is preferably easily increased.

The ratio of the In$_2$O$_3$(ZnO)$_m$ phase having an aspect ratio of 3 or more is measured by integrating the area of the gradation part by means of an image processing software. Specifically, an explanation is made in the Examples.

A hexagonal layered compound having an aspect ratio of 3 or more can be obtained by mixing and pulverizing at an integrated power of 200 Wh or more and sintering at a temperature of 1400° C. or more for 12 hours or longer.

In an oxide sintered body, it is preferred that In be in a solid-solution state in a spinel structure compound represented by Zn$_2$SnO$_4$ and a peak (2θ) be shifted to the side of a narrow angle (minus direction) in a X-ray diffraction. The shifted amount is preferably 0.01 degree or more, more preferably 0.02 degree or more, and particularly preferably 0.03 degree or more. If the shift angle is 0.01 degree or more, solid solution proceeds, a sufficient amount of carriers is generated, whereby resistance of a target can be suppressed low.

The oxide sintered body used in the invention may contain gallium in addition to indium, tin and zinc.

It is preferred that gallium be in a solid-solution state in one or more selected from a hexagonal layered compound represented by In$_2$O$_3$(ZnO)$_m$ or InXO$_3$(ZnO)$_n$, a rutile structure compound and a spinel structure compound.

If a gallium element is contained, the atomic ratio represented by Ga/(In+Sn+Zn+Ga) is preferably 0.01 to 0.35, more preferably 0.02 to 0.30, and further preferably 0.03 to 0.25.

An atomic ratio within the above-mentioned range is preferable since an increase in resistance is suppressed without causing significant lowering in density of a sintered body.

If a gallium element is contained, the atomic ratio of In, Sn and Zn is preferably given below.

The atomic ratio represented by In/(In+Sn+Zn+Ga) is preferably 0.01 to 0.35, more preferably 0.15 to 0.35, and further preferably 0.2 to 0.3.

The atomic ratio represented by Sn/(In+Sn+Zn+Ga) is preferably 0.15 to 0.55, more preferably 0.15 to 0.25, and further preferably 0.17 to 0.22.

The atomic ratio represented by Zn/(In+Sn+Zn+Ga) is preferably 0.3 to 0.7, more preferably 0.5 to 0.7, and further preferably 0.5 to 0.6.

The atomic ratio of the total of an indium element and a gallium element represented by (In+Ga)/(In+Sn+Zn) is preferably 0.02 to 0.35, more preferably 0.03 to 0.30, and further preferably 0.05 to 0.25.

An atomic ratio within the above-mentioned range is preferable since an increase in resistance is suppressed without causing significant lowering in density of a sintered body.

Normally, the oxide sintered body use in the invention comprises substantially an oxide of indium, tin and zinc or substantially an oxide of indium, tin, zinc and gallium. In the specification, the "substantially" means that the effects as the sputtering target are derived from the above-mentioned oxides, or that 95 wt % or more and 100 wt % or less (preferably 98 wt % or more and 100 wt % or less) of the oxide sintered body is formed of the oxide of the invention mentioned above. The oxide sintered body of the invention may comprise only the above-mentioned oxide and contain impurities that are inevitably mixed in.

As long as the advantageous effects of the invention are not impaired, the oxide sintered body may contain magnesium, aluminum, zirconium, titanium, germanium, boron and a lanthanoid in addition to indium, tin, zinc and gallium.

The bulk resistance of the sputtering target of the invention is preferably 300 mΩcm or less, more preferably 100 mΩcm or less, and further preferably 20 mΩcm or less. If the bulk resistance is 300 mΩcm or less, DC sputtering can be conducted stably.

The bulk resistance is measured by the four point-probe.

The relative density of the sputtering target of the invention is preferably 90% or more, more preferably 95% or more and further preferably 98% or more.

If the relative density is 90% or more, the target has a high strength and can prevent occurrence of abnormal discharge since the amount of pores in the target is sufficiently small.

The relative density is obtained by dividing the actually measured value of the target density by the theoretical density.

The 3-point bending strength of the sputtering target is preferably 100 MPa or more, preferably 120 MPa or more and further preferably 150 MPa or more.

A 3-point bending strength of 100 MPa or more is preferable, since the physical strength at the time of bonding or mounting of a target becomes excellent, and chipping or cracks does not occur at the time of sputtering.

The 3-poing bending strength is measured in accordance with JIS R1601.

As mentioned above, in the sputtering target of the invention that is formed of an oxide sintered body having a prescribed crystal structure, since the crystal phase is uniformly distributed, occurrence of abnormal discharge or generation of nodules can be suppressed, and an excellent oxide semiconductor film can be provided in the DC sputtering method.

The sputtering target of the invention can be produced as follows. That is, an indium compound, a tin compound and a zinc compound or an indium compound, a tin compound, a zinc compound and a gallium compound as raw materials are pulverized and mixed at an integrated power of 200 Wh or more to produce powder mixture; granulated powder having a BET specific surface area of 10 m$^2$/g or more and a median diameter of 1 μm or more and 100 μm or less is produced from the powder mixture; the granulated powder is formed into a formed body; and the formed body is retained at a temperature of 1300° C. or higher for 12 hours or longer to conduct sintering forming.

The integrated power is a value obtained by measuring the motor power at each processing and multiplying the motor power by the time.

If mixing and pulverizing are conducted at an integrated power of 200 Wh or more, not only the raw material is pulverized finely but also at least part of the raw material becomes a composite oxide.

By mixing at an integrated power of 200 Wh or more and by sintering for 12 hours or longer at a temperature of 1300° C. or higher, it is possible to distribute each crystal phase uniformly. As a result, occurrence of abnormal discharge or generation of nodules can be suppressed.

Further, if a sputtering target is produced by the above-mentioned method, a crystal in which an In$_2$O$_3$(ZnO)$_m$ phase is grown in the long axis direction is formed, whereby the strength of a sputtering target can be improved.

Hereinbelow, each step will be explained.

(1) Blending Step

In the blending step, compounds of metal elements contained in an oxide sintered body are mixed.

As the raw material, normally, powder of an In compound, powder of an Sn compound, powder of a Zn compound and powder of a Ga compound are used.

As the In compound, indium oxide, indium chloride or the like can be given, for example. As the Sn compound, tin oxide, tin chloride or the like can be given, for example. As the Zn compound, zinc oxide, zinc nitrate or the like can be given, for example. As the Ga compound, gallium oxide, gallium hydroxide or the like can be given, for example. As for the compound of each element, in respect of easiness in sintering, amount of by-products or the like, it is preferable to use an oxide.

If an oxide is used in the raw material, the surface are (BET surface area) of each of indium oxide and tin oxide is normally 3 to 18 $m^2/g$, preferably 7 to 16 $m^2/g$, and more preferably 7 to 15 $m^2/g$.

The surface area (BET surface area) of zinc oxide is normally 3 to 18 $m^2/g$, preferably 3 to 10 $m^2/g$, and more preferably 4 to 10 $m^2/g$.

The surface area (BET surface area) of gallium oxide is normally 6 to 20 $m^2/g$, preferably 8 to 16 $m^2/g$, and more preferably 9 to 15 $m^2/g$.

If the surface area of an oxide is too large, secondary agglomeration tends to occur easily, and not only a long time is taken for pulverizing and mixing, whereby the production cost is increased, but also contamination tends to occur easily at the time of pulverizing and mixing. If the surface area is too small, coarse particles tend to remain in the granulated powder without being pulverized and mixed. As a result, uniformity in crystal phase is deteriorated after sintering, and pores or abnormal grain growth tend to be caused.

The purity of the raw material is normally 2N (99 mass %) or more, preferably 3N (99.9 mass %) or more, particularly preferably 4N (99.99 mass %) or more. If the purity is 2N or more, the resulting sputtering target can have excellent resistance. As a result, entering of impurities to the liquid crystal to cause baking can be prevented.

As the forming aid, polyvinyl alcohol or polyethylene glycol, methyl cellulose, polywax, oleic acid, stearic acid or the like may be added together with the raw material.

(2) Mixing Step

The raw materials are mixed by a mixing and pulverizing means to obtain powder mixture. As the mixing and pulverizing means, a planetary ball mill can be used.

Conditions such as pulverizing time may be appropriately adjusted. The integrated power is 200 Wh or more. The integrated power is preferably 200 to 1000 Wh, further preferably 200 Wh to 600 Wh, and particularly preferably 200 Wh to 400 Wh.

If the integrated power is in the above-mentioned range, uniform pulverized powder can be prepared. In addition, generation of impurities caused by wear of a medium can be prevented, and as a result, impurities can be prevented from segregating in the crystal boundary of the sputtering target or remaining within the target. If impurities are present, characteristics of the thin film formed by sputtering may vary.

(2) Granulating Step

In order to attain easy handling, the resulting powder mixture is allowed to be granulated powder (granulated powder). For example, the powder is dried, and sieved in order to equalize the grain size.

No specific restrictions are imposed on the BET surface area of the granulated powder. The BET surface area is allowed to be 10 $m^2/g$ or more, for example. The BET surface area is preferably 10 to 50 $m^2/g$. If the BET surface area is 10 $m^2/g$ or more, insufficient sintering such as abnormal grain growth can be suppressed, and density or strength of a sintered body is hardly lowered.

The BET surface area can be measured by the method stated in the Examples.

The median diameter of the granulated powder is not particularly restricted. The median diameter is 1 μm or more and 100 μm or less, for example. The median diameter is preferably from 5 μm to 70 μm, more preferably from 5 μm to 50 μm. The median diameter can be adjusted by the granulating and sieving steps. The median diameter can be obtained by means of a laser diffraction particle size analyzer. Specifically, the median diameter can be measured by the method described in the Examples.

By allowing the BET surface area to be 10 $m^2/g$ or more and by allowing the medium diameter to be 1 to 100 μm, a large agglomerate is hardly formed in the resulting oxide sintered body.

(3) Forming Step

In the forming step, the granulated powder is formed into a shape preferable as a target. As the forming process, press molding (uniaxial molding), metallic molding, casting, injection molding or the like can be given, for example. In order to obtain a target having a high sintering density, it is preferable to conduct forming by cold isostatic pressing (CIP) or the like.

If forming is conducted by mere press molding (uniaxial pressing), due to unevenness in pressure, generation of unexpected crystal forms or deformation of crystals may occur.

Further, after press molding (uniaxial pressing), cold isostatic pressing (CIP) or hot isostatic pressing (HIP) or the like can be conducted to provide a forming step comprising two or more steps.

If CIP (cold isostatic pressing or isostatic pressing apparatus) is used, it is preferred that the formed product be retained at a surface pressure of 100 to 4000 $kgf/cm^2$ for 0.5 to 60 minutes, and it is more preferred that the formed product be retained at a surface pressure of 500 to 2000 $kgf/cm^2$ for 2 to 30 minutes. Within this range, it possible to reduce compositional non-uniformity or the like inside the formed body, and uniformity can be expected.

If the surface pressure is within the above-mentioned range, it is possible to increase the density and to reduce the resistance after sintering. As a result, a further larger apparatus is not required to be used, leading to an economical advantage. If the retaining time is in the above-mentioned range, the density after sintering can be increased without fail.

A forming aid such as polyvinyl alcohol, methyl cellulose, polywax or oleic acid may be used during forming process.

(4) Firing Step

In the firing step, the formed body obtained by the forming step is fired. The formed body may be fired by hot isostatic press (HIP) firing or the like.

As for the firing conditions, the formed body is normally fired at 1300 to 1600° C. (preferably 1350 to 1600° C., more preferably 1400 to 1600° C.) for 12 to 360 hours, preferably 18 to 180 hours, and more preferably 24 to 96 hours.

If the firing temperature is within the above-mentioned range, the $In_2O_3(ZnO)_m$ phase grows sufficiently, whereby a crystal having a high aspect ratio can be obtained. In addition, a variation in composition due to vaporization of components or damage of a furnace can be suppressed.

If the firing time is in the above-mentioned range, a crystal having a high aspect ratio can be obtained.

The formed body is normally fired in an oxygen-containing normal-pressure atmosphere (e.g., air) or an oxygen-containing pressurized atmosphere.

If the formed body is fired in an oxygen-containing atmosphere, or fired at 1600° C. or less, it is possible to sufficiently increase the density of the resulting target, or sufficiently suppress occurrence of an abnormal discharge during sputtering.

The temperature elevating rate during firing is normally 8° C./min or less, preferably 4° C./min or less, and more preferably 2° C./min or less. When the temperature elevating rate during firing is 8° C./min or less, cracks rarely occur when decreasing the temperature.

The temperature decreasing rate during firing is normally 4° C./min or less, and preferably 2° C./min or less. When the temperature decreasing rate during firing is 4° C./min or less, cracks rarely occur when decreasing the temperature.

(5) Polishing Step

The oxide sintered body is optionally processed to have a desired shape.

The oxide sintered body is processed by cutting the oxide sintered body to have a shape suitable for installation in a sputtering apparatus, or cutting the oxide sintered body for attaching a jig (e.g. backing plate).

When producing a sputtering target using the oxide sintered body, the sintered body is ground using a surface grinder to have a surface roughness Ra of 5 μm or less, for example. The sputtering surface of the sputtering target may be mirror-finished to have an average surface roughness Ra of 1000 Å or less. The sputtering target may be mirror-finished (polished) by a known polishing technique such as mechanical polishing, chemical polishing, or mechano-chemical polishing (i.e., a combination of mechanical polishing and chemical polishing). For example, the sputtering target may be polished (#2000 or more) using a fixed abrasive polisher (polishing liquid: water), or may be lapped using a free abrasive lap (polishing agent: SiC paste or the like), and then lapped using a diamond paste as an abrasive. The polishing method is not particularly limited.

It is preferable to clean the target after polishing. The target may be cleaned by blowing air, or may be cleaned using running water, for example. When removing foreign matter by blowing air, foreign matter can be more effectively removed by sucking air using a dust collector from the side opposite to the nozzle. Note that the target may be further cleaned by ultrasonic cleaning or the like since the above cleaning method has a limitation. When using ultrasonic cleaning, it is effective to utilize multiple oscillation of ultrasonic waves at a frequency of 25 to 300 KHz. For example, it is preferable to perform ultrasonic cleaning while producing twelve types of ultrasonic waves at intervals of 25 KHz within a frequency range of 25 to 300 KHz.

The resulting sputtering target is bonded to a backing plate. The thickness of the target is normally 2 to 20 mm, preferably 3 to 12 mm, and particularly preferably 4 to 10 mm. A plurality of targets may be bonded to a single backing plate, and may be used as a single target.

The resistivity of the target is preferably $1.0 \times 10^{-4}$ Ωcm or less, further preferably $5.0 \times 10^{-5}$ Ωcm or less when DC sputtering is conducted. Since the resistivity of the target is related with the target density, it is desired that the target be sintered to have a high density. The density is preferably 95% or more, further preferably 98% or more.

The oxide semiconductor thin film (oxide thin film) of the invention is produced by a sputtering method by using the above-mentioned sputtering target.

Due to a high conductivity, a DC sputtering method having a high film-forming speed can be applied to the sputtering target of the invention. In addition to the above-mentioned DC sputtering, the RF sputtering method, the AC sputtering method and the pulse DC sputtering method can be applied to the sputtering target of the invention, and sputtering free from abnormal discharge can be conducted.

The oxide semiconductor thin film of the invention can also be formed by using the above-mentioned sintered body by the deposition method, the ion-plating method, the pulse laser deposition method or the like, in addition to the sputtering method.

As the sputtering gas (atmosphere) when producing the oxide semiconductor thin film of the invention, a mixed gas of a rare gas atom such as argon and an oxidizing gas can be used. Examples of the oxidizing gas include $O_2$, $CO_2$, $O_3$, $H_2O$ (water vapor) and $N_2O$.

It is preferred that the oxygen partial pressure at the time of film formation by sputtering be 0% or more and less than 40%. The oxygen partial pressure is more preferably 0% to 30%, and particularly preferably 0% to 20%. When a semiconductor film is formed by sputtering, if film formation is conducted at a high oxygen partial pressure, film-forming speed may become slow, resulting in lowering in productivity. By conducting film formation with the above-mentioned oxygen partial pressure range, such lowering in productivity can be prevented.

It is preferred that the substrate temperature at the time of film formation by sputtering is preferably 25 to 120° C., further preferably 25 to 100° C., and particularly preferably 25 to 90° C.

If the substrate temperature at the time of film formation is 120° C. or less, oxygen or the like that is introduced at the time of film formation can be sufficiently incorporated, whereby an excessive increase in carrier concentration of a thin film after heating can be prevented. Further, if the substrate temperature at the time of film formation is 25° C. or more, the density of the thin film may not be lowered, and as a result, lowering in mobility of a TFT can be prevented.

It is preferred that the oxide thin film obtained by sputtering be further subjected to an annealing treatment by retaining at 150 to 500° C. for 15 minutes to 6 hours. The annealing treatment temperature after film formation is more preferably 200° C. or more and 450° C. or less, further preferably 250° C. or more and 350° C. or less. By conducting the above-mentioned annealing treatment, semiconductor properties can be obtained.

The heating atmosphere is not particularly restricted. In respect of carrier control properties, air atmosphere, nitrogen atmosphere or oxygen-circulating atmosphere is preferable.

In the annealing process as the post treatment of the oxide thin film, in the presence or absence of oxygen, a lamp annealing apparatus, a laser annealing apparatus, a thermal plasma apparatus, a hot air heating apparatus, a contact heating apparatus or the like can be used.

The distance between the target and the substrate at the time of sputtering is preferably 1 to 15 cm in a direction perpendicular to the deposition surface of the substrate, with 2 to 8 cm being further preferable.

If this distance is 1 cm or more, the kinetic energy of particles of target-constituting elements which arrive the substrate can be prevented from becoming excessively large, good film properties can be obtained, and in-plane distribution or the like of the film thickness and the electric characteristics can be prevented.

If the interval between the target and the substrate is 15 cm or less, the kinetic energy of particles of target-constituting elements can be prevented from becoming too small, and a dense film can be obtained, and as a result, good semiconductor properties can be attained.

As for the formation of an oxide thin film, it is desirable that film formation be conducted by sputtering in an atmosphere having a magnetic field intensity of 300 to 1500 gausses. If the magnetic field intensity is 300 gausses or more, since the plasma density can be prevented from lowering, sputtering may be conducted without problems if the sputtering target has a high resistance. On the other hand, if the magnetic field intensity is 1500 gauss or less, deterioration in controlling property of the film thickness and the electric characteristics of the film cam be prevented.

No specific restrictions are imposed on the pressure of a gas atmosphere (sputtering pressure), as long as plasma is stably discharged. The pressure is preferably 0.1 to 3.0 Pa, further preferably 0.1 to 1.5 Pa, with 0.1 to 1.0 Pa being particularly preferable. If the sputtering pressure is 3.0 Pa or less, the mean free path of sputtering particles does not become too short, thereby preventing lowering of density of a thin film. If the sputtering pressure is 0.1 Pa or more, formation of fine crystals in a film during film formation can be prevented.

Meanwhile, the sputtering pressure is the total pressure in the system at the start of sputtering after a rare gas (e.g. argon), an oxygen gas or the like are introduced.

The above-mentioned oxide semiconductor thin film can be used in a thin film transistor (TFT). It can be used particularly preferably as a channel layer.

No specific restrictions are imposed on the device configuration of the thin film transistor of the invention, as long as it has the above-mentioned oxide thin film as a channel layer. Known various device configurations can be used.

The thickness of the channel layer in the thin film transistor of the invention is normally 10 to 300 nm, preferably 20 to 250 nm, more preferably 30 to 200 nm, further preferably 35 to 120 nm, and particularly preferably 40 to 80 nm. If the thickness of the channel layer is 10 nm or more, the film thickness hardly becomes un-uniform when the layer is formed to have a large area, whereby the properties of a TFT fabricated may become un-uniform within the plane. On the other hand, if the thickness of the channel layer is 300 nm or less, the film formation time does not become too long.

In the thin film transistor of the invention, it is preferred that a protective film be provided on the channel layer. The protective film in the thin film transistor of the invention may comprise oxides such as $SiO_2$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $HfO_2$, $CaHfO_3$, $PbTi_3$, $BaTa_2O_6$, $Sm_2O_3$, $SrTiO_3$ or AlN, or $SiX_x$.

Before forming a protective film, it is preferred that the channel layer be subjected to an ozone treatment, an oxygen plasma treatment, a nitrogen dioxide plasma treatment or a nitrous oxide plasma treatment. Such a treatment may be conducted at any time as long as it is after the formation of a channel layer and before the formation of a protective film. However, it is desirable that the treatment be conducted immediately before the formation of a protective film. By conducting such a pre-treatment, generation of oxygen deficiency in the channel layer can be suppressed.

The thin film transistor is normally provided with a substrate, a gate electrode, a gate-insulating layer, an organic semiconductor layer (channel layer), a source electrode and a drain electrode. The channel layer is as mentioned above. A known material can be used for the substrate.

No particular restrictions are imposed on the material forming the gate insulating film in the thin film transistor of the invention. A material which is generally used can be arbitrary selected. Specifically, a compound such as $SiO_2$, $SiN_x$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $HfO_2$, $CaHfO_3$, $PbTi_3$, $BaTa_2O_6$, $SrTiO_3$, $Sm_2O_3$, AlN or the like can be used, for example. Among these, $SiO_2$, $SiN_x$, $Al_2O_3$, $Y_2O_3$, $HfO_2$ and $CaHfO_3$ are preferable, with $SiO_2$, $SiN_x$, $HfO_2$ and $Al_2O_3$ being more preferable.

The gate insulating film can be formed by the plasma CVD (Chemical Vapor Deposition) method, for example.

If a gate insulating film is formed by the plasma CVD method and a channel layer is formed thereon, hydrogen in the gate insulating film diffuses in the channel layer, and as a result, deterioration of film quality of the channel layer or lowering of reliability of a TFT may be caused. In order to prevent deterioration of film quality of the channel layer or lowering of reliability of a TFT, it is preferred that the gate insulating film be subjected to an ozone treatment, an oxygen plasma treatment, a nitrogen dioxide plasma treatment or a nitrous oxide plasma treatment before the formation of a channel layer. By conducting such a pre-treatment, deterioration of film quality of the channel layer or lowering of reliability of a TFT can be prevented.

The number of oxygen atoms of these oxides does not necessarily coincide with the stoichiometric ratio. It may be $SiO_2$ or $SiO_x$, for example.

The gate insulting film may have a structure in which two or more insulating films made of different materials are stacked. The gate insulating film may be crystalline, polycrystalline, or amorphous. The gate insulating film is preferably polycrystalline or amorphous from the viewpoint of easiness of industrial production.

No specific restrictions are imposed on the material forming each electrode in the thin film transistor, i.e. a drain electrode, a source electrode and a gate electrode, and materials which are generally used can be arbitrarily selected. For example, transparent electrodes such as ITO, IZO, ZnO, and $SnO_2$, metal electrodes such as Al, Ag, Cu, Cr, Ni, Mo, Au, Ti and Ta, or metal electrodes comprising an alloy of these metals can be used.

Each of the drain electrode, the source electrode and the gate electrode may have a multi-layer structure in which two or more different conductive layers are stacked. In particular, since the source/drain electrodes are required to be used in low-resistance wiring, the electrodes may be used by sandwiching a good conductor such as Al and Cu between metals having good adhesiveness such as Ti and Mo.

The thin film transistor of the invention can be applied to various integrated circuits such as a field effect transistor, a logical circuit, a memory circuit and a differential amplifier circuit. Further, in addition to a field effect transistor, it can be applied to a static induction transistor, a Schottky barrier transistor, a Schottky diode and a resistance element.

As for the configuration of the thin film transistor of the invention, a known configuration such as a bottom-gate configuration, a bottom-contact configuration and a top-contact configuration can be used without restrictions.

In particular, a bottom-gate configuration is advantageous since high performance can be obtained as compared with a thin film transistor comprising amorphous silicon or ZnO. The bottom-gate configuration is preferable since the number of masks at the time of production can be decreased easily and the production cost for application such as a large-sized display or the like can be reduced.

The thin film transistor of the invention can preferably be used in an electric apparatus such as a display.

For use in a large-sized display, a channel-etch type bottom-gate thin film transistor is particularly preferable. A channel-etch type bottom-gate thin film transistor can produce a panel for a display at a low cost since the number of photo-masks used in photolithography is small. Of these, a channel-etch type thin film transistor having a bottom-gate configuration and a channel-etch type thin film transistor having a top-contact configuration are preferable since they can be industrialized easily due to excellent properties such as mobility.

EXAMPLES

Example 1

(1) Preparation of Oxide Sintered Body $In_2O_3$ (manufactured by Nippon Rare Metal, Inc., purity: 4N), $SnO_2$ (manufactured by Nippon Rare Metal, Inc., purity: 4N), and ZnO (manufactured by Kojundo Chemical Lab. Co., Ltd., purity: 4N) were used as raw materials. The raw materials were weighed such that the atomic ratio "In:Sn:Zn" became 25:15:60.

$In_2O_3$, $SnO_2$ and ZnO were mixed and pulverized by using a planetary ball mill with an integrated power of 246 Wh. As a medium, zirconia balls having a diameter of 2 mm and zirconia balls having a diameter of 5 mm were used. As a forming aid, polyvinyl alcohol (manufactured by Kuraray Co., Ltd.) was added in an amount of 1 wt % relative to the total amount of the raw material powder.

The mixed and pulverized materials were then dried in a hot air dryer. The resulting powder was subjected to sieving to equalize the grain size, thereby to obtain granulated powder. The BET surface area and the median diameter of the resulting granulated powder were measured by the following method. The BET surface area was 11 $m^2/g$ and the median diameter was 45 μm. The granulated powder was filled in a mold, and was subjected to uniaxial pressing. Then, the pressed powder was further subjected to press molding by cold isostatic pressing (CIP) at a surface pressure of 309 $kgf/cm^2$ and retained for 5 minutes to prepare a formed body.

Thereafter, the formed body was sintered in an electric furnace. The sintering conditions are as follows.
(BET Surface Area)

The surface area was measured by the one-point method by means of a gas adsorption apparatus (manufactured by Yuasa Ionics, Co., Ltd.) using an $N_2$ gas.
(Median Diameter)

A particle size that allows the relative particle frequency measured by a laser diffraction particle size distribution analyzer (manufactured by Shimadzu Corporation) to be 50% was taken as the median diameter.
(Sintering Conditions)
Temperature Elevation Pattern:
Room temperature to 1000° C. Temperature elevating speed 50° C./h
1000° C. to 1400° C. Temperature elevating speed 150° C./h
Sintering temperature: 1400° C.
Sintering time: 48 hours
Sintering atmosphere: Air
Temperature Decreasing Pattern:
1400° C. to room temperature Temperature decreasing rate 100° C./h (2) Preparation of Sputtering Target After sintering, the sintered body having a thickness of 6 mm was ground to have a thickness of 5 mm and a diameter of 4 inches, and polished. A sintered body for a target was cut from the sintered body. The side of the sintered body was cut using a diamond cutter, and the surface of the sintered body was ground using a surface grinder to have a surface roughness Ra of 0.5 μm or less.

Next, the surface was cleaned by blowing air, and then subjected to ultrasonic cleaning for 3 minutes while multiplying twelve types of ultrasonic waves at intervals of 25 kHz within a frequency range of 25 to 300 kHz to obtain a target.

The target was bonded to a backing plate made of oxygen-free copper using indium solder to obtain a target. The target had a surface roughness Ra of 0.5 μm or less, and had a ground surface showing no directivity.
(3) Evaluation of Oxide Sintered Body and Sputtering Target The resulting oxide sintered body and the sputtering target were evaluated as described below.
(Measurement of Density)

The density was calculated by the following expression from the theoretical density calculated from the density of the raw material powder and the density of the sintered body measured by the Archimedes' method. The relative density was 98.9%.

Relative density=(density measured by Archimedes' method)/(theoretical density)×100(%)

(Measurement of Resistivity)

The resistivity was measured in ten points by a four point-probe method (JIS R 1637) using a resistivity meter ("Loresta" manufactured by Mitsubishi Chemical Corporation), and the average value was taken as the resistivity. The resistivity was found to be 2.9 mΩcm.
(Crystal Structure)

The crystal structure was determined by X-ray diffraction measurement (XRD) under the following conditions. As a result, the hexagonal layered compound represented by $In_2O_3(ZnO)_4$ and the spinel structure compound represented by $Zn_2SnO_4$ were identified.

Apparatus: "Ultima-III" manufactured by Rigaku Corporation

X-rays: Cu-Kα line (wavelength: 1.5406 Å, monochromatized using a graphite monochromator)

2θ-θ reflection method, continuous scan (1.0°/min)

Sampling interval: 0.02°

Slit DS, SS: ⅔°, RS: 0.6 mm
(Observation of Crystal Phase)

The sintered body after removing the surface altered layer was cut into a measureable size. The sintered body was then embedded in a resin, and subjected to mirror polishing to prepare a sample for observation. For the sample, as for the element of In, Sn and Zn, an electron probe microanalyzer (EPMA) measurement was conducted with a magnification of 1000 times. As a result, a tin-rich phase (Sn-rich and Zn-small phase) was identified as the $Zn_2SnO_4$ phase and a zinc-rich phase (Sn-small and Zn-rich phase) was identified as the $In_2O_3(ZnO)_m$ phase.

Figure 1:
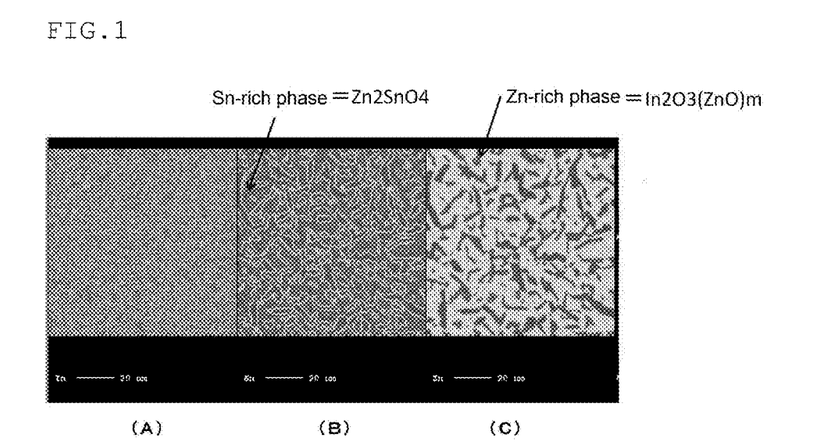
FIG. 1 is a photograph taken by an electron probe microanalyzer (EPMA) of the oxide sintered body obtained in Example 1 (magnification ×1000), in which FIG. 1 (A) is a photograph of an In atom.

The photographs taken by the EPMA are shown in FIGS. 1(A), (B) and (C). FIG. 1(A) is a photograph relating to an In atom, FIG. 1(B) is a photograph relating to an Sn atom and FIG. 1(C) is a photograph relating to a Zn atom. In the EPMA image of tin shown in FIG. 1(B), a red part (dark color part) is a tin-rich part, and in the EPMA image of Zn shown in FIG. 1(C), a red part (dark color part) is a zinc-rich part. In each view field, a part in which the long diameter of the Sn-rich phase is 30 μm or more is defined as an agglomerate, and the area occupied by the agglomerate was obtained by an image analysis. The ratio of the area of the part occupied by an agglomerate relative to the total area was measured at arbitral five view fields, and the average value was obtained. The average value was 0.9%.

Figure 2:
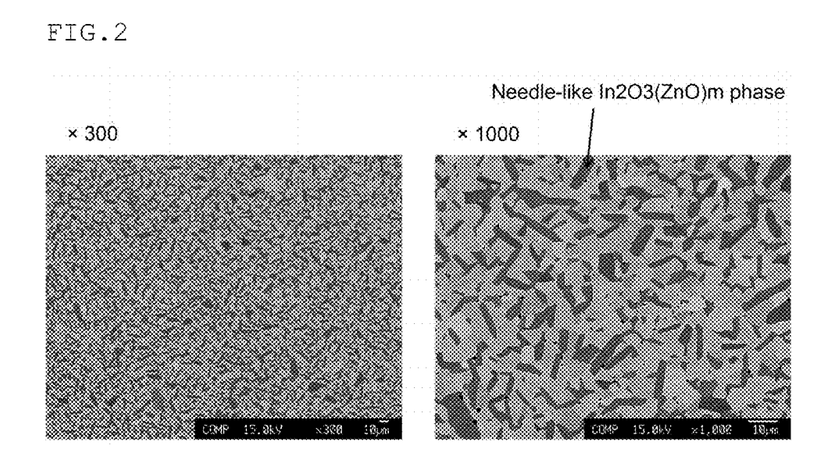
FIG. 2 is a photograph taken by an electron microscope of the cross section of the oxide sintered body obtained in Example 1 (magnification ×300, 1000)

Further, the photograph taken by observing the cross section of the oxide sintered body by an electron microscope (×300, ×1000) is shown in FIG. 2. The aspect ratio of the $In_2O_3(ZnO)_m$ was obtained as follows.

Aspect ratio=particle diameter in the long axis direction/particle size in the short axis direction A hexagonal layered compound as a crystal with an aspect ratio of 3 or more that has grown in the long axis direction (needle-like crystal) was observed. The number of the $In_2O_3(ZnO)_m$ phase that is a crystal grown in the long axial direction having an aspect ratio of 3 or more relative to the total number of $In_2O_3(ZnO)_m$ phases was obtained. The number of crystals grown in the long axial direction accounted for 26% of the total number of $In_2O_3(ZnO)_m$ phases.

(Composition)

The composition was analyzed by means of an inductively coupled plasma atomic emission spectroscopy (ICP-AES, manufactured by Shimadzu Corporation). The atomic ratio was In:Sn:Zn=25:15:60.

(Continuous Discharge Test)

The target was mounted in a DC sputtering deposition apparatus. Continuous sputtering was conducted at a sputtering pressure of 1 Pa, an oxygen concentration of 50% and a DC output of 400 W for 8 hours, and the amount of nodules or yellow flakes generated on the target surface were observed. From the photograph of the sputtering target after the continuous discharge, an area covered by the nodules was calculated, and the density of the generated nodules was calculated by the following formula.

Density of nodules generated=Area of generated nodules/Area of sputtering target As a result, evaluation was conducted in three stages in the ascending order of the amount of nodules generated as follows. The target of this example was evaluated as A.

A: $10^{-2}$ or less
B: Larger than $10^{-2}$ and $10^{-1}$ or less
C: Larger than $10^{-1}$ Variations in voltage during continuous film formation were stored in a data logger to confirm occurrence of abnormal discharge. Occurrence of the above-mentioned abnormal discharge was confirmed by detecting abnormal discharge by monitoring variations in voltage. A case where variations in voltage which occurred during a 5-minute measurement accounted for 10% or more of the steady voltage during the sputtering operation was evaluated as abnormal discharge. A target suffered occurrence of abnormal discharge less than 5 times was evaluated as A, a target suffered occurrence of abnormal discharge of 5 times or more and less than 20 times was evaluated as B, and a target suffered occurrence of abnormal discharge of 20 times or more was evaluated as C. The target of this example was evaluated as A.

(Chromaticity)

The chromaticity was evaluated by using SE6000 manufactured by Nippon Denshoku Industries Co., Ltd. The result was L*=23.6, a*=−3.9 and b*=3.2.

(Three-Point Bending Strength)

The three-point bending strength was evaluated by using ceramics bending test apparatus (manufactured by Shimadzu Corporation) according to JIS R1601. It was found to be 161 MPa.

Examples 2 to 9

Oxide sintered bodies and sputtering targets were manufactured and evaluated in the same manner as in Example 1, except that the raw material and the mixing ratio was changed as shown in Table 1. The results are shown in Table 1.

Here, as $Ga_2O_3$ (raw material), gallium oxide (produced by Nippon Rare Metal, Inc., 4N) was used.

In Table 1, "$In_2O_3(ZnO)_5$", "$In_2O_3(ZnO)_7$" and "$InGaZnO_4$" mean a hexagonal layered compound. "$SnO_2$" means a rutile structure compound, and "$ZnSnO_3$" means an ilmenite structure compound.

Comparative Example 1

(1) Preparation of Oxide Sintered Body and Sputtering Target

As raw materials, $In_2O_3$ (purity 4N, produced by Nippon Rare Metal, Inc.), $SnO_2$ (purity 4N, manufactured by Nippon Rare Metal, Inc.) and ZnO (purity 4N, manufactured by Kojundo Chemical Laboratory. Co., Ltd.) were used and weighed such that the atomic ratio In:Sn:Zn became 25:15:60.

$In_2O_3$, $SnO_2$ and ZnO were mixed and pulverized at an integrated power of 3.2 Wh in a planetary ball mill. As a medium, zirconia balls each having a diameter of 10 mm were used. As a forming aid, polyvinyl alcohol (manufactured by Kuraray Co., Ltd.) was added at a ratio of 1 wt % relative to the total amount of raw material powder.

Next, the resulting mixture was dried in a hot-air dryer. In order to equalize the grain size of the powders thus obtained, the powders were sieved to obtain granulated powder. The BET surface area and the median diameter of the granulated powder obtained were measured in the same way as in Example 1. The BET surface area was 8 $m^2$/g, and the median diameter was 110 μm. The granulated powder was filled in a mold and subjected to uniaxial pressing. After that, they were further subjected to pressing at a surface pressure of 3000 kgf/$cm^2$ under a retaining time of 5 minutes by cold isostatic pressing (CIP) to prepare a formed body.

Thereafter, the formed body was sintered in an electric furnace. The conditions for sintering were the same as in Example 1.

Moreover, a sputtering target was prepared in the same manner as in Example 1.

(2) Evaluation of Oxide Sintered Body and Sputtering Target

The oxide sintered body and sputtering target were evaluated in the same manner as in Example 1. The results are as follows.

(Measurement of Density)

The relative density was 97.5%.

(Measurement of Resistivity)

The resistivity was 8.6 mΩcm.

(Crystal Structure)

A $Zn_2SnO_4$ phase and an $In_2O_3(ZnO)_4$ phase were contained.

(Observation of Crystal Phase)

Figure 3:
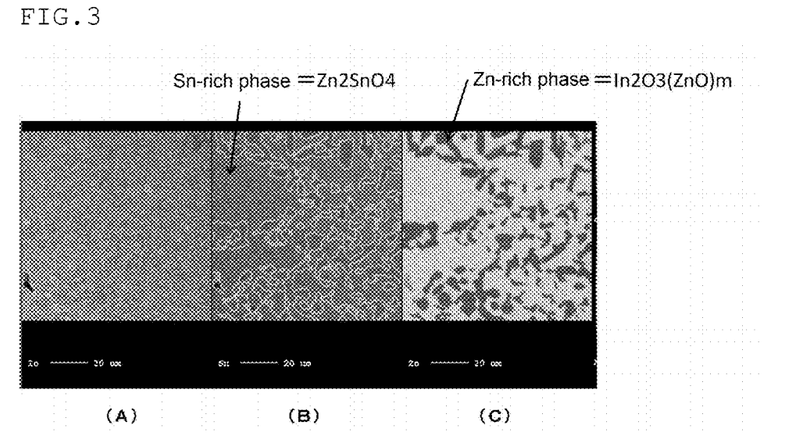

FIGS. 3 (A) to (C) show photographs obtained by EPMA in the same manner as in Example 1. FIG. 3 (A) shows a photograph for an In atom, FIG. 3 (B) shows a photograph for an Sn atom and FIG. 3(C) shows a photograph for a Zn atom. The ratio of the area occupied by an agglomerate, which was determined in the same manner as in Example 1, relative to the entire area was 33%.

Figure 4:
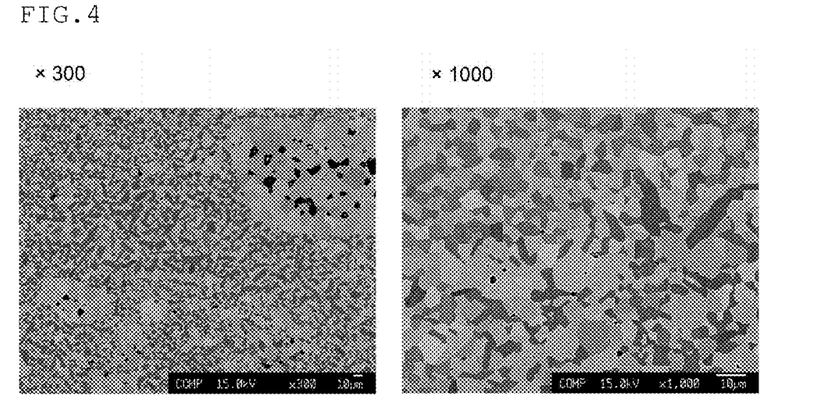
FIG. 4 is a photograph taken by an electron microscope of the cross section of the oxide sintered body obtained in Comparative Example 1 (magnification ×300, 1000).

Further, FIG. 4 shows a photograph obtained by an electron microscope of the cross-section of the oxide sintered body (×300, ×1000). The observed hexagonal layered compound contained crystals with an aspect ratio of 3 or more which grew in the long axis direction and spherical crystals with an aspect ratio of 2 or less in a mixed manner. The ratio of the $In_2O_3(ZnO)_m$ phase which grew in the long axis direction relative to the total $In_2O_3(ZnO)_m$ phases was 9%.

(Composition)

The composition was analyzed by using inductively coupled plasma atomic emission spectrometry (ICP-AES, manufactured by Shimadzu Corporation). The atomic ratio of In, Sn and Zn was In:Sn:Zn=25:15:60.

(Continuous Discharge Test)

The density of nodules generated and the abnormal discharge were each evaluated as C.

(Chromaticity)

The chromaticity was evaluated by using SE6000 manufactured by Nippon Denshoku Industries Co., Ltd. The result was L*=25.2, a*=−3.9 and b*=3.2.

(Three-Point Bending Strength)

The three-point bending strength was evaluated by using ceramics bending test apparatus (manufactured by Shimadzu Corporation) according to JIS R1601.

Comparative Examples 2 and 3

Oxide sintered bodies and sputtering targets were produced and evaluated in the same manner as in Comparative Example 1, except that the raw material and the mixing ratio was changed as shown in Table 1. The results are shown in Table 1.

TABLE 1

| | | Examples | | | | | |
|---|---|---|---|---|---|---|---|
| | | 1 | 2 | 3 | 4 | 5 | 6 |
| Composition | In (at %) | 25 | 25 | 15 | 25 | 15 | 20 |
| | Sn (at %) | 15 | 20 | 20 | 25 | 30 | 20 |
| | Zn (at %) | 60 | 55 | 65 | 50 | 55 | 60 |
| | Ga (at %) | — | — | — | — | — | — |
| Mixing | Integrated power (Wh) | 246 | 246 | 246 | 246 | 246 | 246 |
| BET surface area (m²/g) | | 11 | 11 | 8 | 15 | 12 | 11 |
| Median diameter (μm) | | 45 | 32 | 45 | 12 | 15 | 27 |
| Crystal structure | | $In_2O_3(ZnO)_4$ $Zn_2SnO_4$ | $In_2O_3(ZnO)_4$ $Zn_2SnO_4$ | $In_2O_3(ZnO)_5$ $In_2O_3(ZnO)_7$ $Zn_2SnO_4$ | $Zn_2SnO_4$ $ZnSnO_3$ | $In_2O_3(ZnO)_7$ $Zn_2SnO_4$ | $In_2O_3(ZnO)_5$ $Zn_2SnO_4$ |
| Ratio of needle crystal (%) | | 26 | 18 | 24 | — | 22 | 28 |
| Ratio of aggregated area (%) | | 0.9 | 1.0 | 2.2 | 1.3 | 4.3 | 1.1 |
| Relative density (%) | | 98.9 | 98.6 | 98.1 | 99.0 | 98.2 | 99.2 |
| Resistivity (mΩcm) | | 2.9 | 4.3 | 2.5 | 3.6 | 3.3 | 4.2 |
| Chromaticity | L* | 23.6 | 24.0 | 23.8 | 23.3 | 25.3 | 20.5 |
| | a* | −3.9 | −3.9 | −3.9 | −3.9 | −3.9 | −3.7 |
| | b* | 3.2 | 3.2 | 3.2 | 3.2 | 3.2 | 3.3 |
| Density of generated nodule | | A | A | A | A | A | A |
| Abnormal discharge | | A | A | A | A | B | A |
| Three-point bending strength (MPa) | | 161 | 138 | 153 | 127 | 152 | 161 |

| | | Examples | | | Comparative Examples | | |
|---|---|---|---|---|---|---|---|
| | | 7 | 8 | 9 | 1 | 2 | 3 |
| Composition | In (at %) | 5 | 10 | 10 | 25 | 25 | 25 |
| | Sn (at %) | 30 | 30 | 30 | 15 | 25 | 15 |
| | Zn (at %) | 50 | 50 | 40 | 60 | 50 | 60 |
| | Ga (at %) | 15 | 10 | 20 | — | — | — |
| Mixing | Integrated power (Wh) | 246 | 246 | 246 | 3.2 | 3.2 | 124 |
| BET surface area (m²/g) | | 14 | 12 | 14 | 8 | 3 | 5 |
| Median diameter (μm) | | 21 | 15 | 26 | 110 | 540 | 460 |
| Crystal structure | | $SnO_2$ $Zn_2SnO_4$ | $SnO_2$ $Zn_2SnO_4$ | $SnO_2$ $InGaZnO_4$ $Zn_2SnO_4$ | $In_2O_3(ZnO)_4$ $Zn_2SnO_4$ | $Zn_2SnO_4$ $ZnSnO_3$ | $In_2O_3(ZnO)_4$ $Zn_2SnO_4$ |
| Ratio of needle crystal (%) | | — | — | — | 9 | 7 | 12 |
| Ratio of aggregated area (%) | | 3.2 | 1.7 | 2.2 | 33 | 42 | 16 |
| Relative density (%) | | 98.6 | 98.3 | 98.9 | 97.5 | 96.4 | 97.9 |
| Resistivity (mΩcm) | | 4.4 | 4.7 | 4.9 | 8.6 | 12.4 | 8.5 |
| Chromaticity | L* | 21.4 | 20.6 | 20.2 | 25.2 | 26.1 | 33.3 |
| | a* | −4.1 | −3.9 | −4.3 | −3.9 | −3.9 | −1.2 |
| | b* | 3.5 | 3.6 | 3.4 | 3.2 | 3.2 | 0.6 |
| Density of generated nodule | | A | A | A | C | C | C |
| Abnormal discharge | | A | A | A | C | C | C |
| Three-point bending strength (MPa) | | 140 | 154 | 139 | 93 | 87 | 91 |

The sputtering target of the invention can be used in the production of a semiconductor thin film that constitutes a thin film transistor used in a liquid crystal display, an EL display or the like.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The Japanese application specification claiming priority under the Paris Convention are incorporated herein by reference in its entirety.

The invention claimed is:

1. A sputtering target comprising an oxide sintered body that comprises an indium element, a tin element and a zinc element, wherein
the atomic ratio of the indium element, the tin element and the zinc element is within the following range, $$0.01 \leq In/(In+Sn+Zn) 0.35$$

the oxide sintered body comprises one or more selected from a hexagonal layered compound represented by $In_2O_3(ZnO)_m$, a hexagonal layered compound represented by $InXO_3(ZnO)_n$, a rutile structure compound represented by $SnO_2$ and an ilmenite structure compound represented by $ZnSnO_3$, and a spinel structure compound represented by $Zn_2SnO_4$,
in the formulas, X is a metal element that can form a hexagonal layered compound together with an indium element and a zinc element, m is an integer of 1 or more and n is an integer of 1 or more, and
an agglomerate of the spinel structure compound is 5% or less of the entire sintered body, and the three-point bending strength of the oxide sintered body is 120 MPa or more, wherein the hexagonal layered compound represented by $In_2O_3(ZnO)_m$ comprises needle-like crystals having an aspect ratio of 3 or more in an amount of 10% or more.

2. The sputtering target according to claim 1, wherein the oxide sintered body comprises the hexagonal layered compound represented by $In_2O_3(ZnO)$.

3. The sputtering target according to claim 1, wherein the oxide sintered body comprises a gallium element.

4. The sputtering target according to claim 3, wherein the gallium element is in a solid solution state in one or more selected from the hexagonal layered compound represented by $In_2O_3(ZnO)_m$, the hexagonal layered compound represented by $InXO_3(ZnO)_n$, the rutile structure compound and the spinel structure compound.

5. The sputtering target according to claim 3, wherein the atomic ratio of the indium element, the tin element, the zinc element and the gallium element is within the following range:

$$0.01 \leq In/(In+Sn+Zn+Ga) \leq 0.35$$

$$0.15 \leq Sn/(In+Sn+Zn+Ga) \leq 0.55$$

$$0.3 \leq Zn/(In+Sn+Zn+Ga) \leq 0.7$$

$$0.01 \leq Ga/(In+Sn+Zn+Ga) \leq 0.35.$$

6. The sputtering target according to claim 5, wherein the atomic ratio of the total of the indium element and the gallium element is within the following range:

$$0.02 \leq (In+Ga)/(In+Sn+Zn) \leq 0.35.$$

7. The sputtering target according to claim 1, wherein X is a gallium element.

8. The sputtering target according to claim 1, wherein the oxide sintered body comprises the hexagonal layered compound represented by $InXO_3(ZnO)_n$.

9. The sputtering target according to claim 1, wherein the oxide sintered body does not comprise a bixbyite structure.

10. The sputtering target according to claim 1, wherein the atomic ratio of the indium element, the tin element and the zinc element is within the following range:

$$0.01 \leq In/(In+Sn+Zn) \leq 0.35$$

$$0.15 \leq Sn/(In+Sn+Zn) \leq 0.55$$

$$0.3 \leq Zn/(In+Sn+Zn) \leq 0.7.$$

11. The sputtering target according to claim 10, wherein the atomic ratio of the indium element, the tin element and the zinc element is within the following range:

$$0.15 \leq In/(In+Sn+Zn) \leq 0.35$$

$$0.15 \leq Sn/(In+Sn+Zn) \leq 0.25$$

$$0.5 \leq Zn/(In+Sn+Zn) \leq 0.7.$$

12. A method for producing the sputtering target according to claim 1 comprising:
pulverizing and mixing raw material compounds by using a planetary ball mill at an integrated power of 200 Wh or more to produce powder mixture;
granulating the powder mixture to produce granulated powder having a BET surface area of 10 m$^2$/g or more and a median diameter obtained by means of a laser diffraction particle size analyzer of 1 μm or more and 100 μm or less;
forming the granulated powder to produce a formed body; and
sintering the formed body by retaining at a temperature of 1300° C. or higher for 12 hours or longer to obtain the oxide sintered body.

13. A sputtering target that is produced by the method according to claim 12.

14. An oxide semiconductor thin film formed by a sputtering method by using the sputtering target according to claim 1.

15. A thin film transistor comprising the oxide semiconductor thin film according to claim 14.

16. An electronic apparatus comprising the thin film transistor according to claim 15.

* * * * *